United States Patent [19]

Tanimoto et al.

[11] Patent Number: 4,690,528
[45] Date of Patent: Sep. 1, 1987

[54] PROJECTION EXPOSURE APPARATUS

[75] Inventors: Akikazu Tanimoto, Yokohama; Kazunori Imamura, Tokyo, both of Japan

[73] Assignee: Nippon Kogaku K. K., Tokyo, Japan

[21] Appl. No.: 656,746

[22] Filed: Oct. 1, 1984

[30] Foreign Application Priority Data

Oct. 5, 1983 [JP] Japan ............................... 58-186266
Oct. 7, 1983 [JP] Japan ............................... 58-187866
Oct. 7, 1983 [JP] Japan ............................... 58-187867

[51] Int. Cl.⁴ ............................................... G03B 3/10
[52] U.S. Cl. ..................................... 353/101; 353/122
[58] Field of Search .................... 353/101, 121, 122; 355/44, 53, 55, 56; 350/418, 419, 253

[56] References Cited

U.S. PATENT DOCUMENTS 2,080,120  5/1937  Everett ........................... 350/253 X
3,520,601  7/1970  Abbott ............................. 353/60 X

*Primary Examiner*—Harry N. Haroian
*Attorney, Agent, or Firm*—Shapiro and Shapiro

[57] ABSTRACT

A projection exposure apparatus used to project a minute pattern formed on a photomask or reticle onto a semiconductive wafer has a stabilized image-forming performance. The apparatus comprises a projection lens system including a plurality number of lens elements spaced apart from each other, means for supplying a gas flow to at least one of spaces through which the gas passes, means for isolating the space(s) supplied with gas from atmosphere and means for changing the refractive index of the isolated space(s).

17 Claims, 11 Drawing Figures

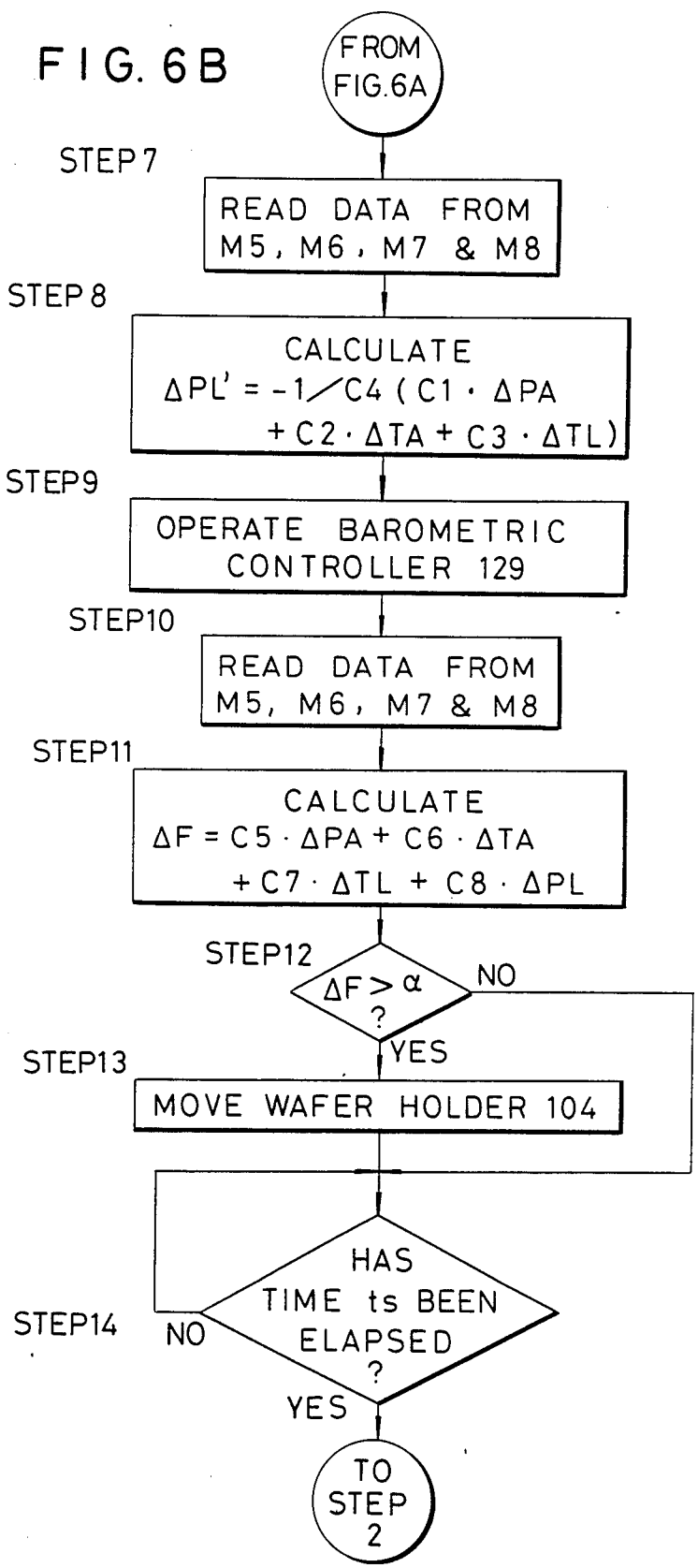

PROJECTION EXPOSURE APPARATUS

BACKGROUND OF THE INVENTION

1. Field of the Invention

The present invention relates to a projection exposure apparatus. More particularly the present invention relates to apparatus for stabilizing the performance of the optical system in such a projection exposure apparatus which is used to project a minute pattern formed on a photomask or reticle onto a semiconductive wafer.

2. Description of the Prior Art

At present the projection exposure apparatus with a projection lens is playing an important role in the production of VLSIs for the high accuracy of alignment and matching attainable by it. In projection exposure an image of a pattern formed on the photomask or reticle is projected at a determined magnification on the semiconductive wafer coated with photo resist through a projection lens. The accuracy of matching is one of the important requirements for the projection exposure apparatus. The matching accuracy is affected by many factors. Among them the error in magnification of the projection optical system is a determinative one.

The size of the pattern used for the manufacture of VLSIs is very small and in this technical field there is an increasing tendency to further reduce the pattern size. With the tendency toward smaller pattern size, the need for improvement in matching accuracy is enhanced. Therefore it is highly required to keep the magnification of projection constant at a selected value. Conventionally the magnification of the projection optical system is adjusted at the time of setting of the apparatus so that the error in magnification may be negligibly small at first. However, there is the possibility that a remarkable amount of error in magnification may be caused by slight change of atmospheric conditions surrounding the apparatus such as temperature change during the work time of the apparatus, small variation of the barometric pressure within the clean room in which the apparatus has been set etc. In order to improve the accuracy of matching such an error of matching must be prevented.

Data obtained from our various experiments have shown that the projection magnification (Y) of a projection lens varies as a function f of atmospheric pressure (PA), atmospheric temperature (TA) and the temperature of lens (TL), that is, $$Y = f(PA, TA, TL) \quad (1)$$

Also, it has been found that the position of image plane or focal point (F) of a projection lens is a function g of the same variables PA, TA and TL, namely $$F = g(PA, TA, TL) \quad (2).$$

It is a common practice in the art to mount the projection exposure apparatus within a clean room in which the allowable variation in temperature is only ±0.1° C. However, sometimes the apparatus is mounted in a clean room in which the variation of temperature may be in the order of ±1° C. Another thing to be noted is that the clean room is usually not sealed against the atmospheric pressure and therefore the pressure of the air surrounding the projection lens is variable with the change of the atmospheric pressure. Furthermore, the temperature of the projection lens itself is raised by the exposure light because in the projection exposure apparatus there is used a light of strong energy to project an image of a circuit pattern onto the photo resist coated on the wafer. Consequently it may be said that the projection exposure apparatus is in such atmosphere containing various factors which cause changes of optical properties (the magnification of projection, the position of focal plane etc.) of the projection lens.

The problem mentioned above may be solved by containing the projection exposure apparatus in a temperature-constant and pressure-constant clean room. However, this solution needs a large and elaborate temperature-constant and pressure-constant chamber which is not suitable or acceptable for the production of ICs from a practical point of view.

SUMMARY OF THE INVENTION

Accordingly it is the main object of the present invention to provide a novel apparatus for maintaining the image-forming performance of the projection lens constant in the above-mentioned type of projection exposure apparatus.

More specifically it is an object of the invention to provide a projection optical apparatus which is protected from error in magnification and variation in focal point of the projection lens as caused by the variation of temperature and/or atmospheric pressure.

It is another object of the invention to provide a projection optical apparatus which is protected from thermal change of the projection caused by the energy of exposure light.

In the apparatus according to the invention, to attain the objects, gas controlled under a determined condition is so supplied as to flow between optical elements constituting the projection lens.

Further, according to the invention, the barometric pressure existing between the above optical elements and between other optical elements of the projection lens is controlled to eliminate the adverse effects of changes of atmospheric pressure and atmospheric temperature. Thereby the image-forming performance of the projection lens is kept stable.

In a preferred embodiment of the invention, a part or all of the spaces divided by plural lens elements of the projection lens are isolated from the atmospheric air and a temperature-controlled and pressure-controlled gas is introduced into the isolated spaces.

Other and further objects, features and advantages of the invention will appear more fully from the following description taken in connection with the accompanying drawings.

BRIEF DESCRIPTION OF THE DRAWINGS

FIGS. 6A and 6B are a flow chart showing the manner of control operation of the first embodiment;

DESCRIPTION OF PREFERRED EMBODIMENTS

Figure 1:
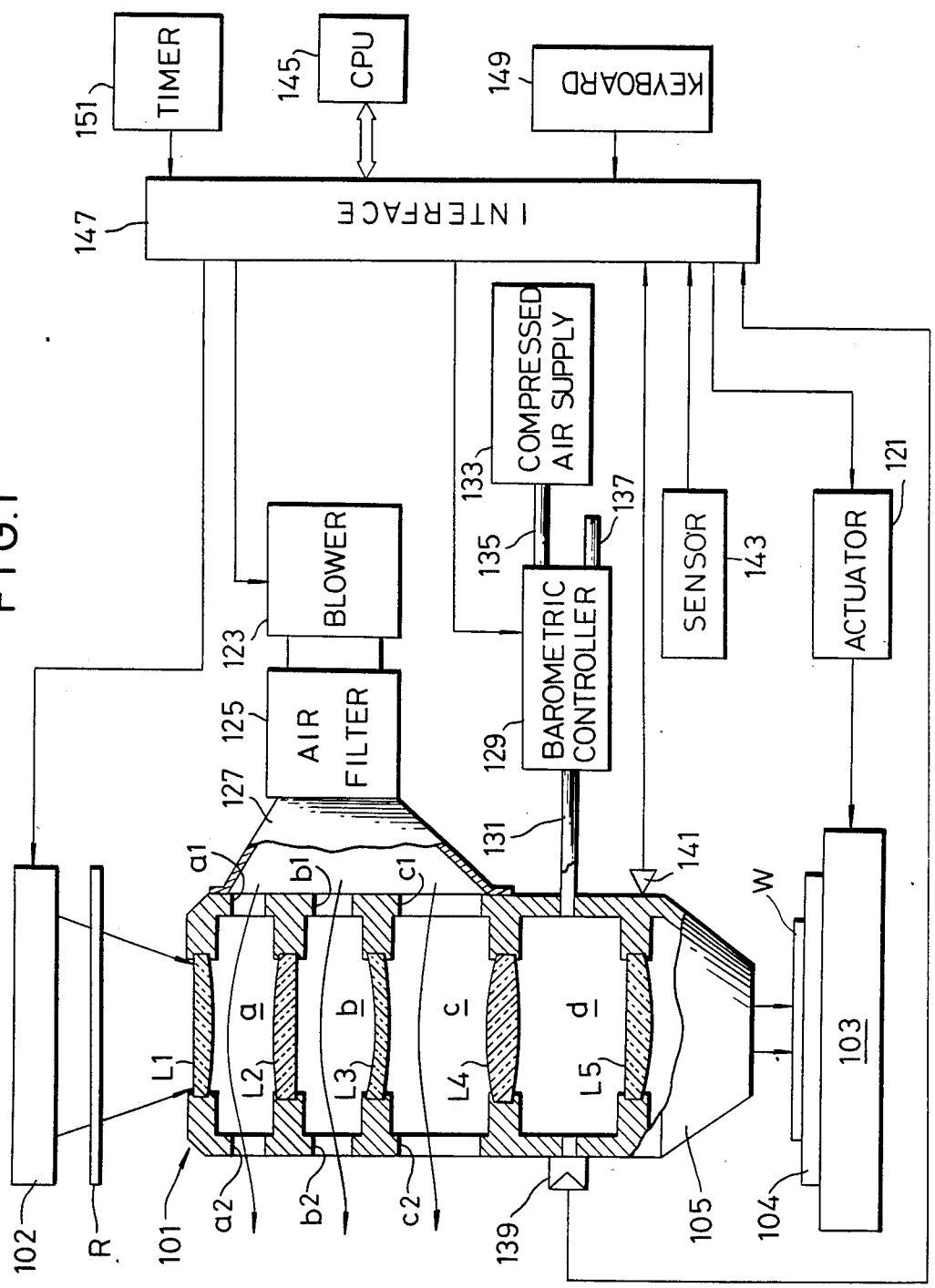
FIG. 1 is a partially sectional front view of a projection exposure apparatus showing an embodiment of the invention.

FIG. 1 shows a first embodiment of a projection exposure apparatus provided with an air controller for a projection lens according to the invention.

On a reticle R there is an original pattern not shown. The original pattern is illuminated by an illumination device 102 and a light image of the pattern is formed on a wafer W by a projection lens 101.

The wafer W is supported on a stage 103 provided with a wafer holder 104 to move the wafer two-dimensionally. The wafer holder 104 holds the wafer by vacuum suction and also can move the wafer up and down in the direction along the optical aixs of the projection lens 101. An actuator 121 drives the stage 103 two-dimensionally and drives the wafer holder up and down.

Figure 2:
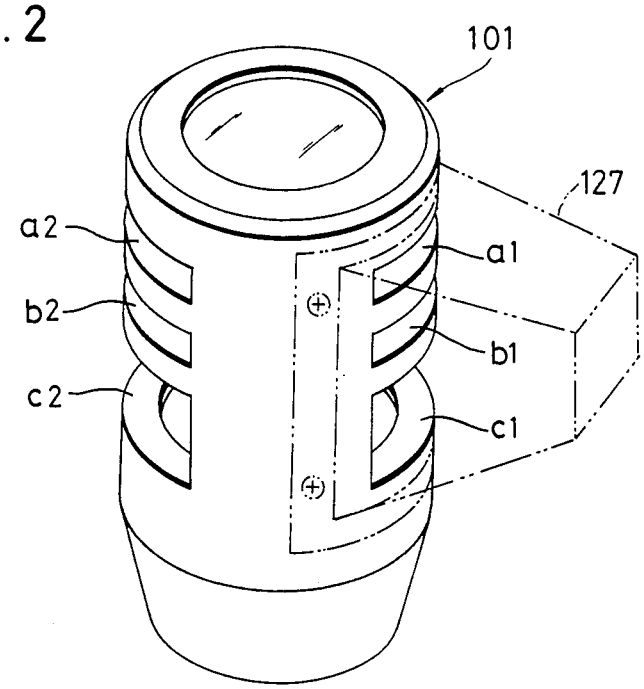
FIG. 2 is a perspective view of the projection lens shown in FIG. 1.

The projection lens 101 has lenses L1, L2, L3, L4 and L5 arranged in lens barrel 105. As seen from FIG. 2, the space a between lenses L1 and L2 is in communication with the exterior through a pair of air holes a1 and a2 formed at the corresponding positions on the side wall of the lens barrel 105. Similarly, the space b between lenses L2 and L3 communicates with the exterior through a pair of corresponding air holes b1 and b2, and the space c between L3 and L4 does through a pair of air holes c1 and c2. The space d between lenses L4 and L5 is sealed against the exterior by means of O-rings or the like.

Air taken in from the external atmosphere by a blower 123 passes through an air filter 125 by which dust and foreign particles are screened off. After passing through the air filter, the air enters a duct 127 which forms an air passage between the air filter and the lens barrel. Guided by the duct 127 the air flows into the above-mentioned spaces a, b and c through the air holes a1, b1 and c1 respectively. The air fed into the spaces a1, b1 and c1 is exhausted from the spaces through the air holes a2, b2 and c2 on the opposite side.

The space d between lenses L4 and L5 is connected with a barometric controller 129 through a pipe 131. The barometric controller is connected to a compressed air supply 133 through a pipe 135. The pressure in the space d is controlled by the barometric controller 129 as desired. The pressure in the space increases when the compressed air is supplied from the compressed air supply 133 through the controller 129. On the contrary, the pressure in the space drops when the air is exhausted from the space to the exterior by the controller. The barometric controller 129 is provided with two solenoid valves which are shown in FIG. 3.

Figure 3:
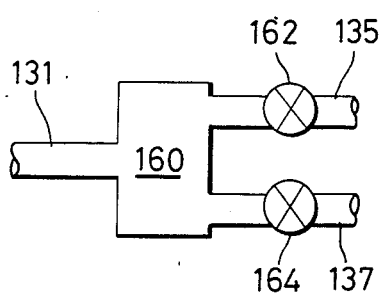
FIG. 3 is a schematic view showing a concrete form of the barometric controller.

Referring to FIG. 3 the pipe 135 communicating with the compressed air supply 133 is connected with an air chamber 160 through the first solenoid valve 162. The air chamber 160 is connected with an exhaust pipe 137 through the second solenoid valve 164 on one side. On the other side, the air chamber 160 is connected with the space d through the above-mentioned pipe 131. In order to increase the pressure in the space d one closes the second valve 164 and opens the first one. Thereby the compressed air flows into the space d from the compressed air supply 133 to raise the pressure in the space. When the pressure reaches the level of $\Delta Y = 0$, the first valve 162 is closed. Thus, the pressure in the space d is maintained. When the pressure in the space is to be decreased, the second valve 164 is opened while keeping the first valve 162 closed.

The pressure in the space d is detected by a pressure detector 139. The temperature of the projection lens 101, especially that of the lens L5 is detected by a temperature detector 141 which may be, for example, a thermocouple. The pressure and temperature of the external atmosphere are detected by an atmosphere sensor 143. A microcomputer (CPU) 145 reads the outputs from the pressure detector 139, temperature detector 141 and sensor 143 through an interface 147. The CPU 145 also controls the operations of the illumination device 102, blower 123, barometric controller 129 and actuator 121 through the interface 147.

Figure 4:
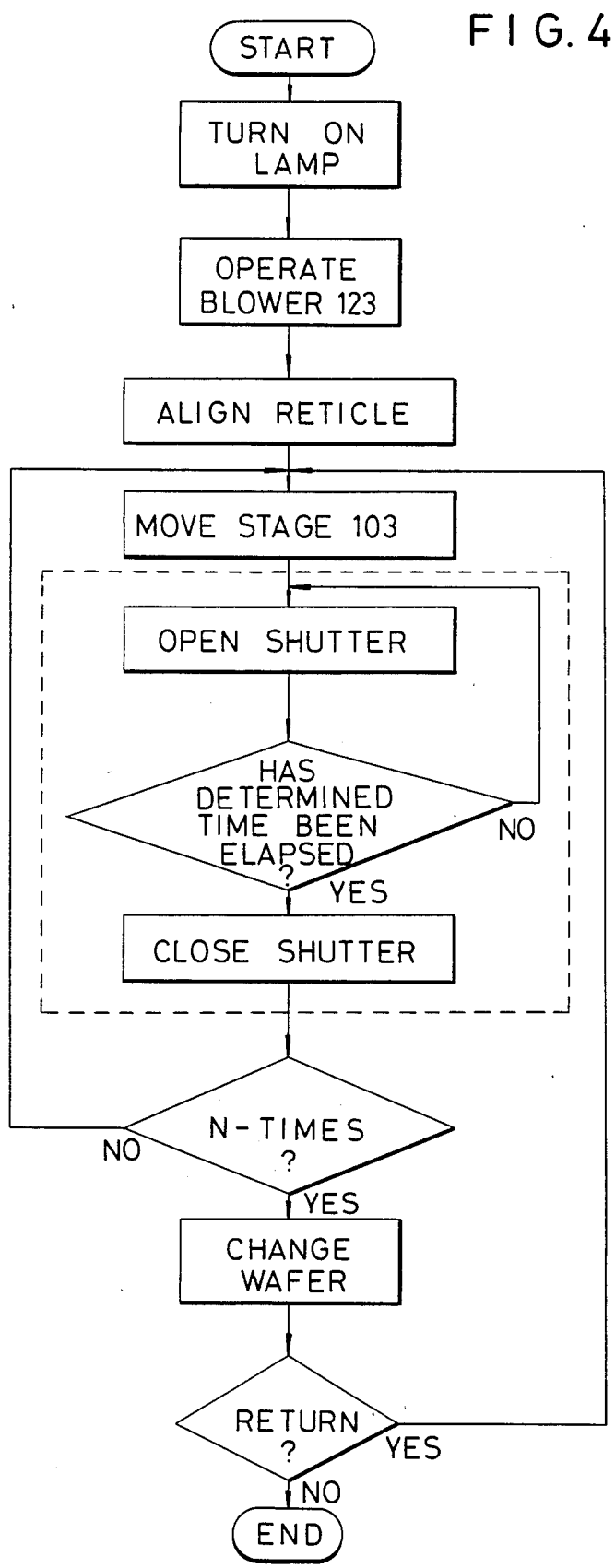
FIG. 4 is a flow chart showing the basic operation of the first embodiment.

In response to the input of operation start instruction by a keyboard 149 the CPU 145 operates and controls the illumination device 102, blower 123 and actuator 121 in the sequence shown in FIG. 4.

Figure 5:
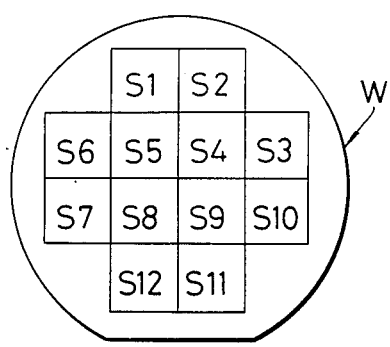
FIG. 5 is a view showing the exposure area of a wafer.

At first a mercury lamp in the illumination device 102 is turned on and then the blower 123 is brought into operation to feed air into the spaces a, b and c. Thereafter the alignment and fixing of the reticle R is carried out and an instruction is transmitted to the actuator 121 from the CPU. In response to the instruction, the actuator 121 moves the stage 103 to the position at which an image of the circuit pattern of the reticle R is formed on the section S1 (see FIG. 5) of the wafer W. After completing the positioning of the stage, a shutter in the illumination device is opened to expose the coated photo resist on the wafer W to the light image of the circuit pattern. After the lapse of a determined exposure time, the shutter is closed. The same operation is repeated for the remaining sections from S2 to S12 of the wafer W while shifting the stage 103 every time. When it is detected that the operation has been repeated N times (12 times), the stage 103 is moved to the position for wafer change. The above cycle of operation is repeated for the new wafer. At the completion of exposures of a determined number of wafers, the operation of the apparatus is finally terminated.

During the operation of exposure described above, a portion of the energy of the exposure light incident on the projection lens 101 is absorbed by lenses L1–L5. However, the air from the blower cools the lenses and prevents any deformation of the lenses by the light energy.

The air fed into the spaces a, b and c from the blower 123 has a pressure substantially equal to the atmospheric pressure or higher than the latter by a determined value. No particular pressure-control is carried out for the air to keep it at a constant pressure level against the variation of the atmospheric pressure. The lens L5 is not air-cooled. Under these conditions the image-forming properties of the projection lens 101 change as follows:

As for the projection magnification (lateral magnification) Y of the projection lens 101, it is a function of the pressure of atmosphere PA, the temperature of atmosphere TA, the temperature of lens L5 TL and the pressure in the space d PL, which is represented by $$Y = f1(PA, TA, TL, PL) \quad (3).$$

Assuming that there occurred changes of the atmospheric pressure, atmospheric temperature, lens temperature and the pressure in the space d by $\Delta PA$, $\Delta TA$, $\Delta TL$ and $\Delta PL$ respectively from the state represented by the above formula (3), the change of projection magnification $\Delta Y$ resulting therefrom is approximately $$\Delta Y = C1 \cdot \Delta PA + C2 \cdot \Delta TA + C3 \cdot \Delta TL + C4 \cdot \Delta PL \quad (4)$$

wherein C1, C2, C3 and C4 are constants obtained by measurement or calculation. Setting the equation (4) as $\Delta Y = 0$ and solving the equation regarding $\Delta PL$ gives:

$$\Delta PL' = -\frac{1}{C4}(C1 \cdot \Delta PA + C2 \cdot \Delta TA + C3 \cdot \Delta TL). \quad (5)$$

This means that the magnification error can be reduced to zero by suitably controlling the pressure in the space d in accordance with the measured values of the atmospheric pressure, atmospheric temperature and lens temperature.

Similarly to the above, the position of focal plane F is a function of the atmospheric pressure PA, atmospheric temperature TA, lens temperature TL and pressure in space d PL, which function g1 is represented by $$F = g1 (PA, TA, TL, PL) \quad (6).$$

The change of the position of focal plane $\Delta F$ resulting from small changes of the variables can approximately be represented by $$\Delta F = C5 \cdot \Delta PA + C6 \cdot \Delta TA + C7 \cdot \Delta TL + C8 \cdot \Delta PL \quad (7).$$

wherein C5, C6, C7 and C8 are constants obtained by measurement or calculation. Therefore, the wafer can correctly be exposed by moving it in the optical axis direction a distance corresponding to the shift of focal point known from the equation (7).

Figure 6A:
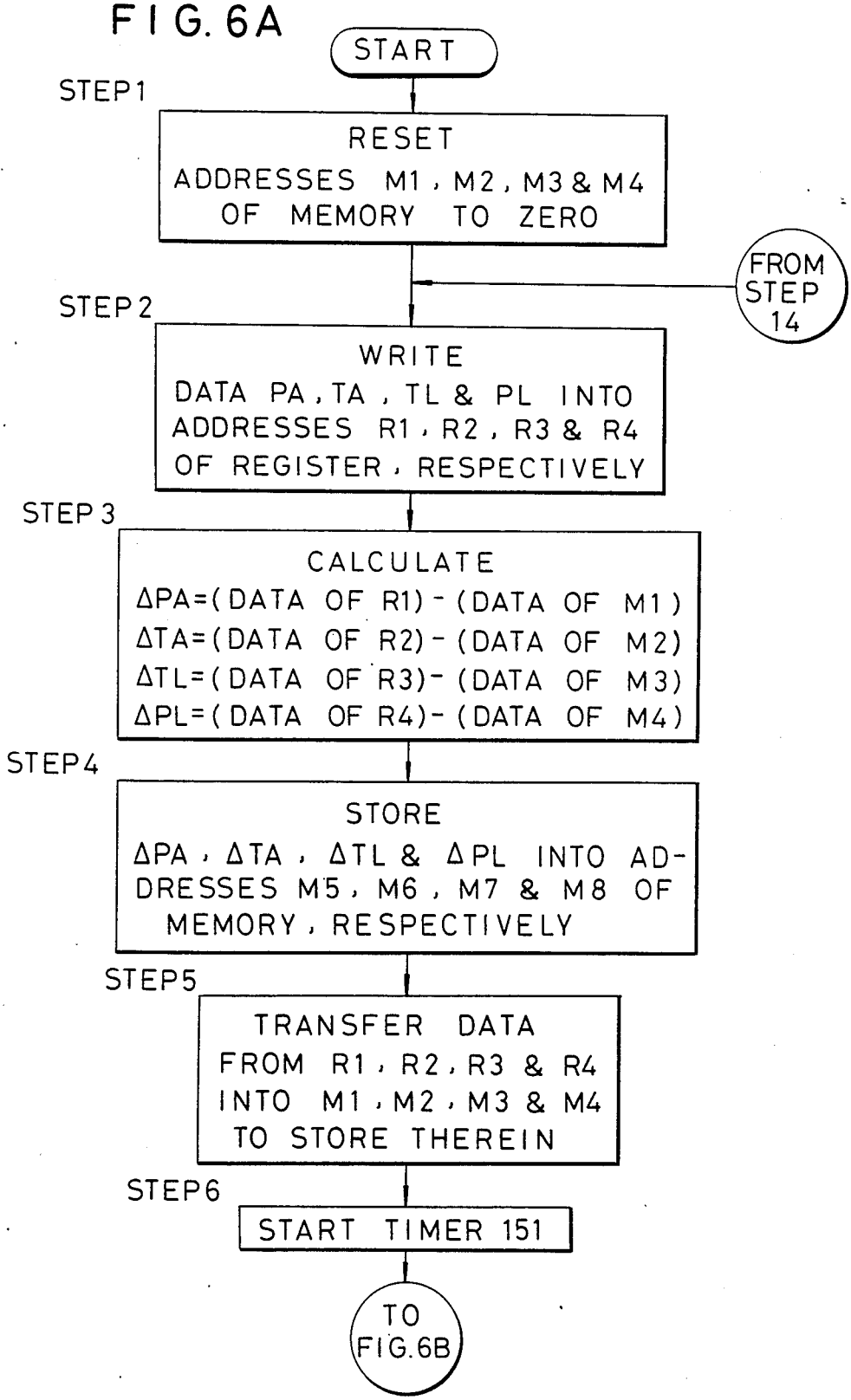

FIGS. 6A and 6B show the manner of operation of the CPU 145 for controlling the projection exposure apparatus.

In the computer there is contained a memory of which address M1 is for storing data of atmospheric pressure, address M2 for storing data of atmospheric temperature, address M3 for storing data of lens temperature and address M4 for storing data of the pressure in the space d. In response to the input of an operation start instruction from the keyboard 149 of the projection exposure apparatus, the CPU resets the addresses M1, M2, M3 and M4 to zero.

At the next step, Step 2 the CPU writes data from sensor and detectors in the corresponding addresses of an operational register which is also contained in the computer. Thus, data of atmospheric pressure PA from the sensor 143 is written in the address R1 of the register, data of atmospheric temperature TA from the same sensor 143 in the address R2, data of lens temperature TL from the temperature detector 141 in the address R3 and data of the presssure in space d PL from the pressure detector 139 in the address R4.

At Step 3, the CPU calculates $\Delta PA$ by subtraction (data of R1)−(data of M1), $\Delta TA$ by (data of R2)−(data of M2), $\Delta TL$ by (data of R3)−(data of M3) and $\Delta PL$ by (data of R4)−(data of M4). These obtained data $\Delta PA$, $\Delta TA$, $\Delta TL$ and $\Delta PL$ are stored in the addresses M5, M6, M7 and M8 of the register respectively at Step 4.

Thereafter, at Step 5, the data in the address R1 of the register is transferred into the address M1 of the memory and stored therein. Similarly, data are transferred from R2 into M2, from R3 into M3 and from R4 into M4 and stored therein respectively. After completing the transfer of data, a timer 151 starts counting a determined time ts which determines the period of sampling of atmospheric pressure and temperature.

At Steps 7 to 9, the CPU reads data from the addresses M5, M6, M7 and M8 and calculates $\Delta PL'$ by the equation (5). In accordance with the found value of $\Delta PL'$ the CPU regulates the pressure in the space d through the barometric controller 129 so as to reduce the magnification change $\Delta Y$ to zero ($\Delta Y = 0$). Subsequent to this, the CPU 145 reads data again from the addresses M5, M6, M7 and M8 of the memory and calculates $\Delta F$ from the equation (7). The found value of $\Delta F$ is compared with a constant $\alpha$ to know whether the $\Delta F$ is negligibly small as compared with the depth of focus of the projection lens 101. If $\Delta F > \alpha$, it means that the change of the position of focal plane is not negligible. Therefore, in this case, the CPU moves the wafer holder 104 up or down through the actuator 121. When $\Delta F < \alpha$, the flow of operation is jumped to Step 14 at which the timer 151 is being monitored to detect the lapse of the preset time ts. When the time ts has elapsed, the flow of operation is returned to Step 2. By the way, the time ts is so preset as to secure the operation time of the first and second regulating valves 162 and 164 as well as the operation time of the actuator 121.

Figure 7:
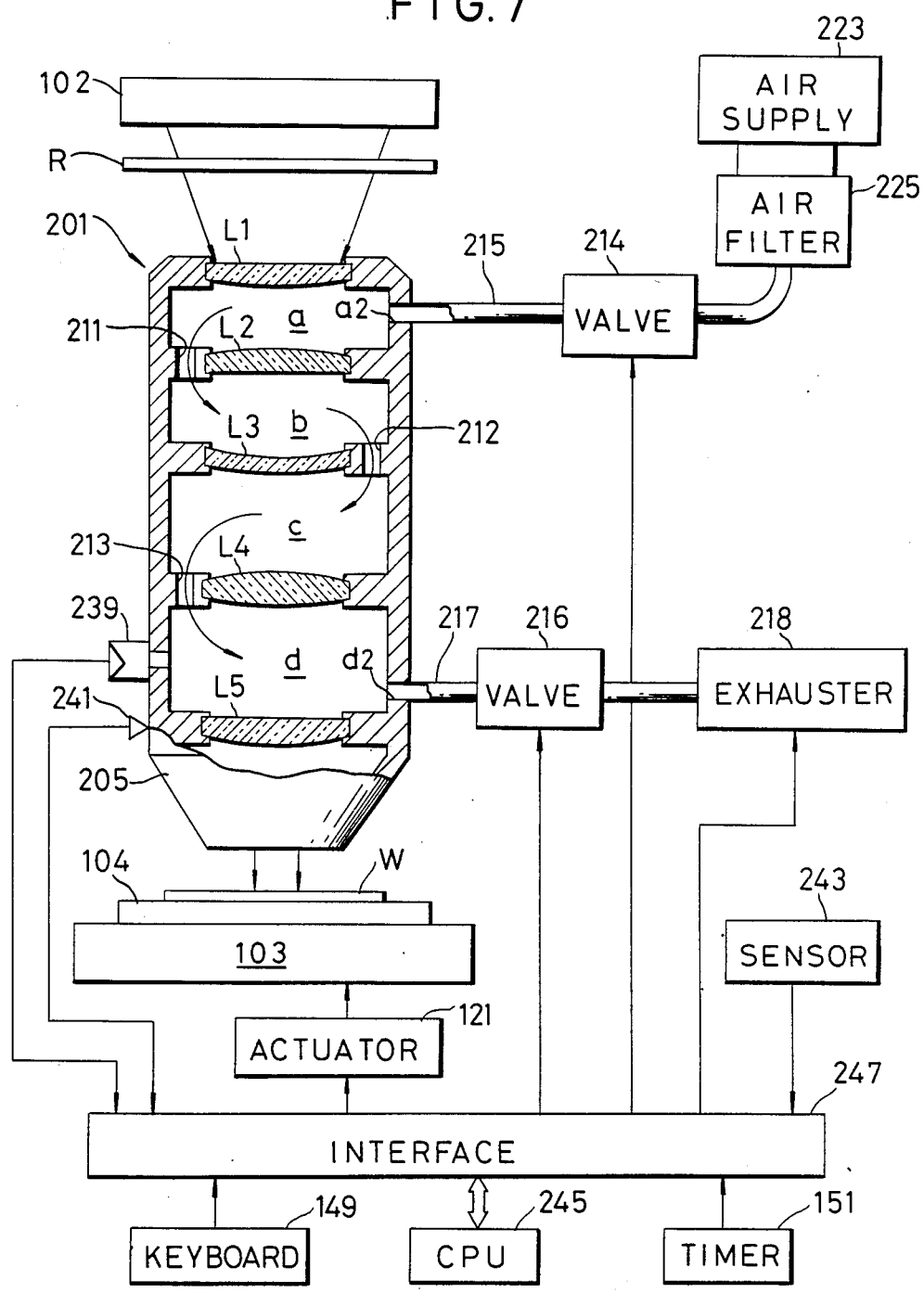
FIG. 7 is a partially sectional front view of a projection exposure apparatus showing a second embodiment of the invention.

FIG. 7 shows a second embodiment of the invention.

In this second embodiment, the spaces between every two lens elements are sealed against the atmospheric pressure. Air pressure-controlled independently of the atmospheric pressure is supplied into the closed spaces.

Referring to FIG. 7, the projection lens 201 again has five lenses L1, L2, L3, L4 and L5 arranged in a lens barrel 205. The space a between the lenses L1 and L2 has an air hole a2 open to the outside of the lens barrel 205. The space b between the lenses L2 and L3 communicates with the above space a through an air hole 211. The space c between the lenses L3 and L4 communicates with the space b through an air hole 212. The space d between the lenses L4 and L5 communicates with the space c through an air hole 213. The space d has also an air hole $d_2$ open to the outside of the lens barrel 205. The inner air holes 211, 212, 213 are formed, for example, in the lens support frame. Except for the air holes a2 and d2, all of the spaces a, b, c and d are hermetically sealed against the exterior of the lens barrel 205.

Air from an air supply 223 enters at first an air filter 225 which may be, for example, a high efficiency particulate air filter. Dust and foreign particles in the air are filtered off by the air filter. The filtered air enters a first valve 214 for regulating the flow rate of the air. The air regulated in flow rate by the first valve 214 flows into the space a through a pipe 215 and the above-mentioned air hole a2. The air hole d2 of the space d is connected to a second regulating valve 216 through a pipe 217. The second regulating valve 216 is connected with an exhauster 218 on the other side. As seen from the above, the air from the air supply 223 is flow-rate regulated by the first regulating valve 214 at first and then flows from the space a to the space d passing through the spaces b and c, and further flows into the second regulating valve 216 by which the flow rate of the air is again regulated. After the flow-rate being regulated by the second regulating valve, the air is guided into the exhauster 218 by which the air is exhausted into the external atmosphere. Therefore, the pressure in the lens barrel 205 can be controlled in accordance with the value of resistance against the air flow determined by the regulating valves 214 and 216.

The pressure in the space d is detected by a pressure detector 239 and the temperature of the lens L5 is detected by a temperature detector 241. An atmosphere sensor 243 detects the pressure of the external atmosphere and also the temperature of the atmosphere. A microcomputer CPU 245 reads the outputs of the detectors 239, 241 and sensor 243 through an interface 247 to control the illumination device 102, regulating valves 214, 216 and the actuator 121.

The basic operations of the second embodiment are substantially the same as those of the first embodiment previously described with reference to the flow charts shown in FIG. 4 and FIGS. 6A and 6B. But, the part of operation of the blower 123 in the first embodiment is replaced by the operation of air supply 223 and also the operation of the barometric controller 129 is replaced by that of the first and second regulating valves 214 and 216.

Figure 8:
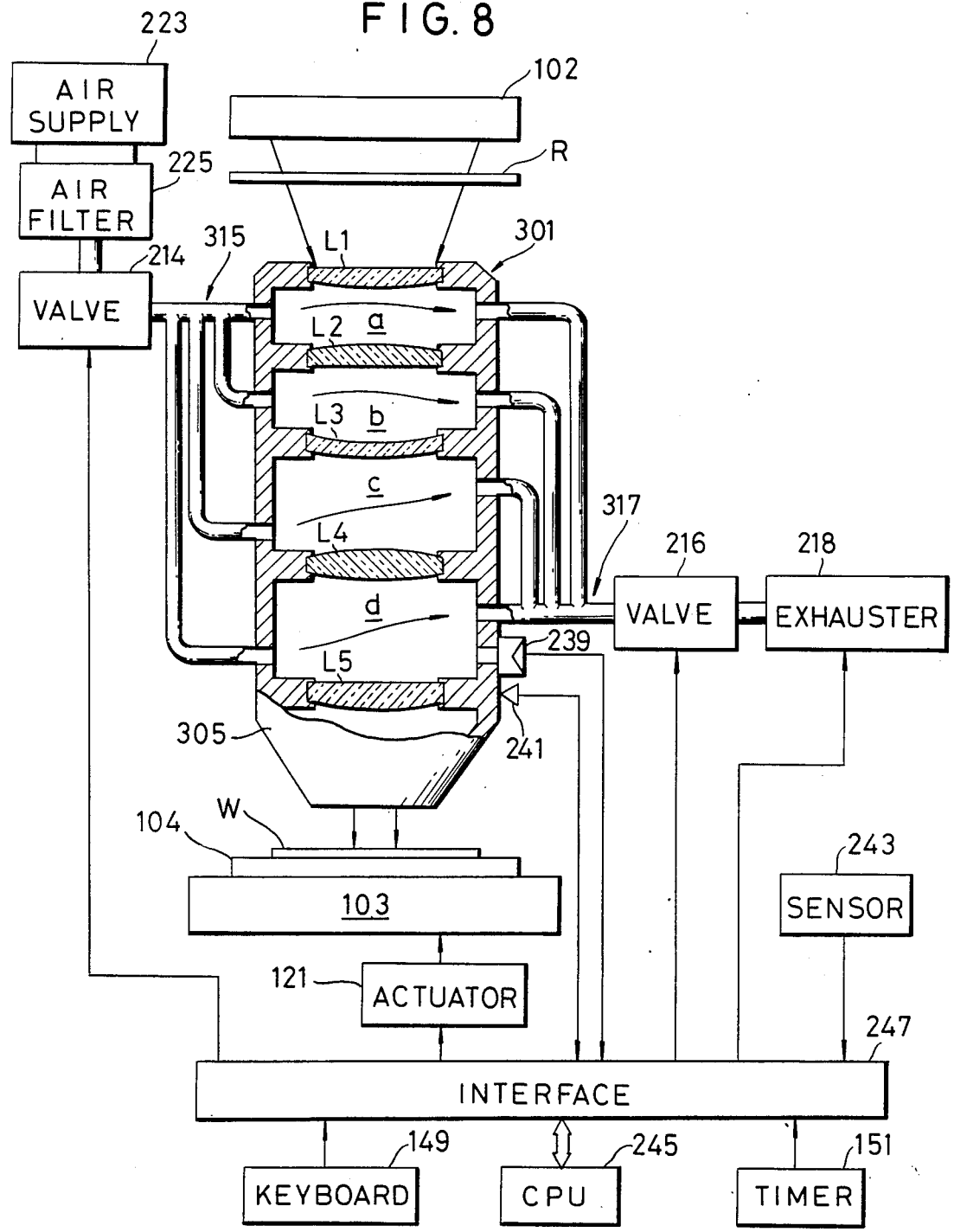
FIG. 8 shows a modification of the second embodiment.

The second embodiment shown in FIG. 7 may be modified as shown in FIG. 8.

In the modification shown in FIG. 8, the air passed through the air filter 225 and the regulating valve 214 is parallel-supplied to the spaces a, b, c and d in the lens barrel 305 through a branched pipe 315. Further, the air is parallel-exhausted from the spaces through a branched pipe 317. This parallel arrangement contrasts with the serial arrangement in the embodiment previously shown in FIG. 7. Other parts of the modification shown in FIG. 8 correspond to those of the embodiment shown in FIG. 7. Consequently they need not be further described.

Compared with the modification shown in FIG. 8, the embodiment shown in FIG. 7 has an advantage that the same degree of temperature-stabilizing effect can be attained by a lower flow rate of supply air. However, in case that there is no limitation imposed on the flow rate, the modification shown in FIG. 8 can stabilize the lens temperature more advantageously than the embodiment shown in FIG. 7 because in the modification the resistance against the air flow is small.

In the second embodiment and its modification shown above, the flow of air has been induced by exhausting the air by the exhauster 218. However, the air from the air filter 225 may be forcedly fed into the lens barrel by a compressor or a blower. Further, gas from a high pressure gas container may be used. Even liquefied or solidified gas may be used after transforming it again to normal gas and adjusting the temperature of it to a desired value.

Although the air has been exhausted into the atmosphere in the above embodiments, it is also possible to return the air to the filter for reuse. Such an embodiment is shown in FIG. 9 as a third embodiment of the invention.

Figure 9:
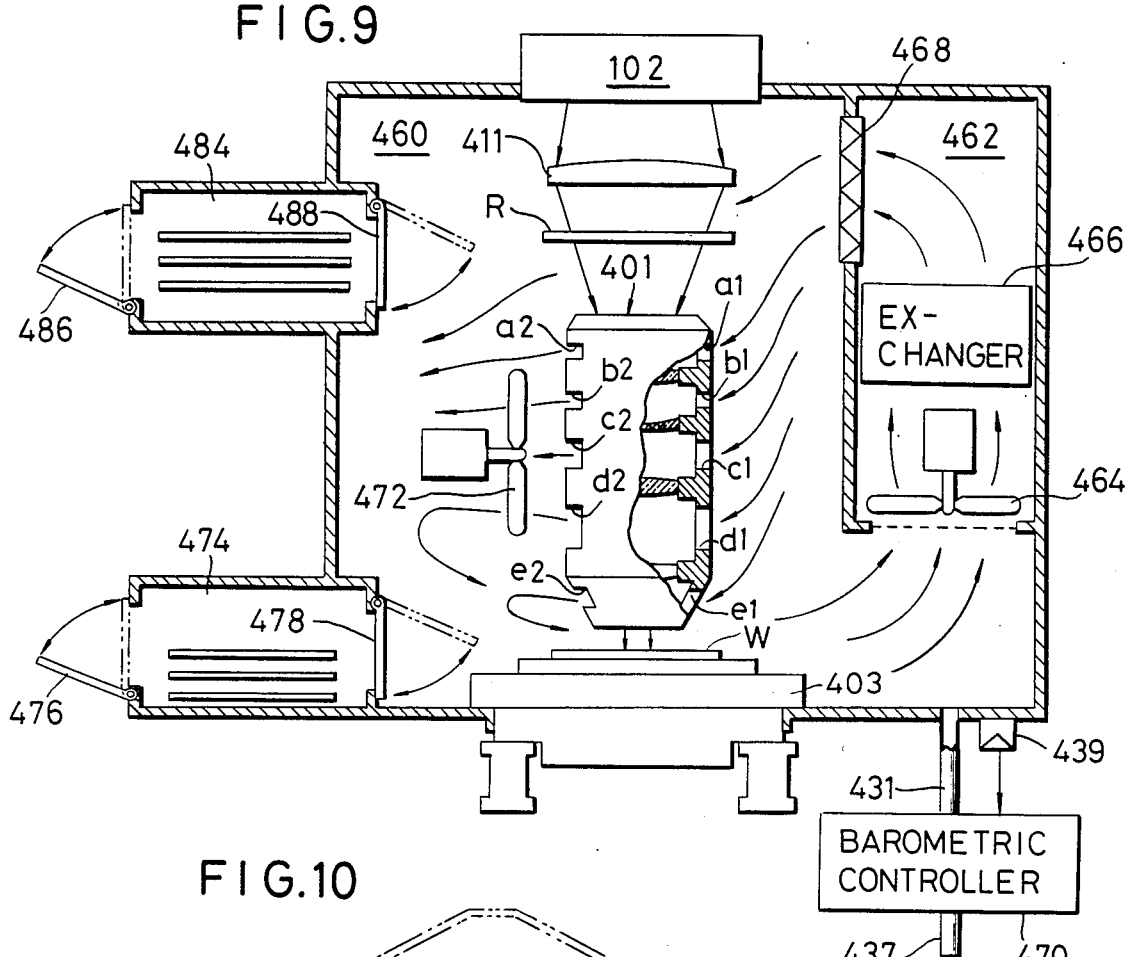
FIG. 9 is a schematic front view of a projection exposure apparatus showing a third embodiment of the invention.

In the third embodiment shown in FIG. 9, a larger part of the projection exposure apparatus including reticle R, projection lens 401, wafer W, stage 403 and condenser lens 411 is enclosed in a housing which forms a hermetically sealed chamber 460.

Again, air holes a1 to e1, a2 to e2 are formed in the circumferential wall of the lens barrel of the projector lens 401. Through the air holes the spaces a to e between lens elements of the projection lens are in communication with the atmosphere outside of the lens barrel.

In the chamber 460 there is provided a thermoregulator 462 for regulating the temperature of the gas within the chamber (the gas may be, for example, air, nitrogen, helium, carbon dioxide or Freon gas). The thermoregulator is constituted of a blower 464, a heat exchanger 466 and a filter 468. The blower 464 generates a flow of the gas toward the heat exchanger from under to over. In the exchanger, the gas is temperature-regulated to a determined constant temperature. The temperature-regulated gas from the heat exchanger enters the filter 468 and comes out from the filter at the upper side of the chamber.

The heat exchanger 466 is constituted of, for example, a cooler, a heater, a temperature sensor and a control circuit. The temperature sensor detects the temperature of the gas leaving the heat exchanger and sends information of the gas temperature to the control circuit. The control circuit controls the cooler and the heater in such manner as to have the gas temperature reach the determined value. Therefore, the gas coming out from the filter 468 has always the determined constant temperature.

The filter 468 is a high efficiency particulate air filter which is able to filter off very small dust (up to a particle size in the order of sub-micron) from the gas passing through the filter. The filter exhausts the air into the chamber as a clean gas.

A pressure sensor 439 detects the pressure of the chamber gas and sends a detection signal to a barometric controller 470. In accordance with the detection signal the barometric controller controls the chamber pressure to a determined value through a pipe 431. The barometric controller is composed of a compressor for feeding gas into the chamber through a pipe 437 and an exhauster for exhausting the chamber gas.

The chamber contains also a fan 472 which forcedly flows the gas toward the area surrounding the projection lens. As indicated by the arrow in FIG. 9, the fan 472 serves to positively direct the clean gas from the filter 468 of the thermoregulator toward the projection lens. As a result, there is produced a stream of gas flowing through the spaces a, b, c, d and e passing through the air holes a1~e1, a2~e2 of the projection lens. The gas stream has an effect to reduce thermal deformation of the lens elements of the projection lens which absorb a portion of the energy of the light incident on the projection lens.

In the chamber described above, the surfaces of the individual lens elements of the projection lens are always exposed to the regulated gas of a determined temperature, for example, 25° C. and a determined pressure, for example, 760 mm Hg. Therefore, even when the temperature of the lens elements rises due to their absorption of the light energy, the optical properties of the lens elements themselves do not change. Further, as the pressure in the spaces a~e is kept constant, there occurs no change of refractive index by the spaces. In consequence the projection lens is protected from being changed in optical property such as magnification or focal point and can maintain its initial property.

In projection exposure it is required to exchange the used reticle R and wafer W for new ones. To this end, the embodiment shown in FIG. 9 includes a wafer storage chamber 474 for keeping a stock of wafers and a reticle storage chamber 484 for keeping a stock of reticles. These storage chambers 474 and 484 are independent of the chamber 460.

The wafer storage chamber 474 has a front door 476 and a rear door 478 hinged for opening and closing. The front door can close the storage chamber air-tightly against the external atmosphere. The rear door faces to the interior of the operation chamber 460. When the rear door 478 is closed, the storage chamber is completely isolated from the operation chamber. The two doors 476 and 478 are so controlled as not to be opened at the same time. The wafer storage chamber 474 can receive not only single wafers but also a wafer cassette containing therein a plurality number of wafers in tiers. When a single wafer is conveyed into the storage chamber, the front door 476 is opened while keeping the rear door 478 closed. After the wafer has been received in the storage chamber, the front door is closed at first and then the rear door is opened. Through the rear door now being open, the wafer is further conveyed to the stage 403 by an automatic conveying means not shown. When a wafer cassette is transported into the storage chamber, the front door is opened to receive it and after receiving it the front door is closed. After the front door being closed, the rear door is opened and is kept opened to supply the wafers one by one to the stage 403 from the wafer cassette by automatic conveying means. After exposure, the exposed wafer is returned to the wafer cassette and the next wafer is supplied to the stage from the cassette.

Like the wafer storage chamber, the reticle storage chamber 484 has a front door 486 facing to the external atmosphere and a rear door 488 facing to the interior of the operation chamber. The front door closes the storage chamber air-tightly against the external atmosphere. The rear door, when closed, isolates the storage chamber from the operation chamber 460. The reticle storage chamber can receive not only single reticles but also a plurality of reticles at the same time. The front and rear doors 486 and 488 are controlled in the same manner as described above for the doors of the wafer storage chamber. Therefore, the front and rear doors 486 and 488 are never opened at the same time.

The pressure within the operation chamber 460 may change more or less when the rear door 478 and/or the rear door 488 are opened. If the volume of the storage chambers 474, 484 is sufficiently small relative to the volume of the operation chamber 460 and if the pressure difference between the chamber 460 and the external atmosphere is small, the change of the pressure in the chamber 460 will be small. However, if the pressure difference is large, then an abrupt change of the pressure in the chamber 460 will be caused by the opening of the door 478 and/or the door 488. In this case, the pressure change can be reduced by opening the rear door slowly thereby slowing down the speed of gas leak between the operation chamber and the storage chamber. In this manner, the speed of the pressure change may be reduced to a speed which the regulation speed of the barometric regulator 470 can amply follow. The same effect may be obtained by providing a barometric controller also in each storage chamber to control the pressure in the storage chamber to the same level as that in the operation chamber.

For the convenience of taking in and out wafers there may be provided two or more wafer storage chambers 474. For example, there may be provided a wafers storage chamber only for feeding wafer into the operation chamber and a separate wafer storage chamber only for taking out wafers from the chamber. By doing so, the through-put of the apparatus may be improved. In this case, each of the separate wafer storage chambers may further be divided into compartments so that one compartment can be kept open to the external atmosphere during the time of the other being closed. This is more convenient for the operation of wafer change.

Figure 10:
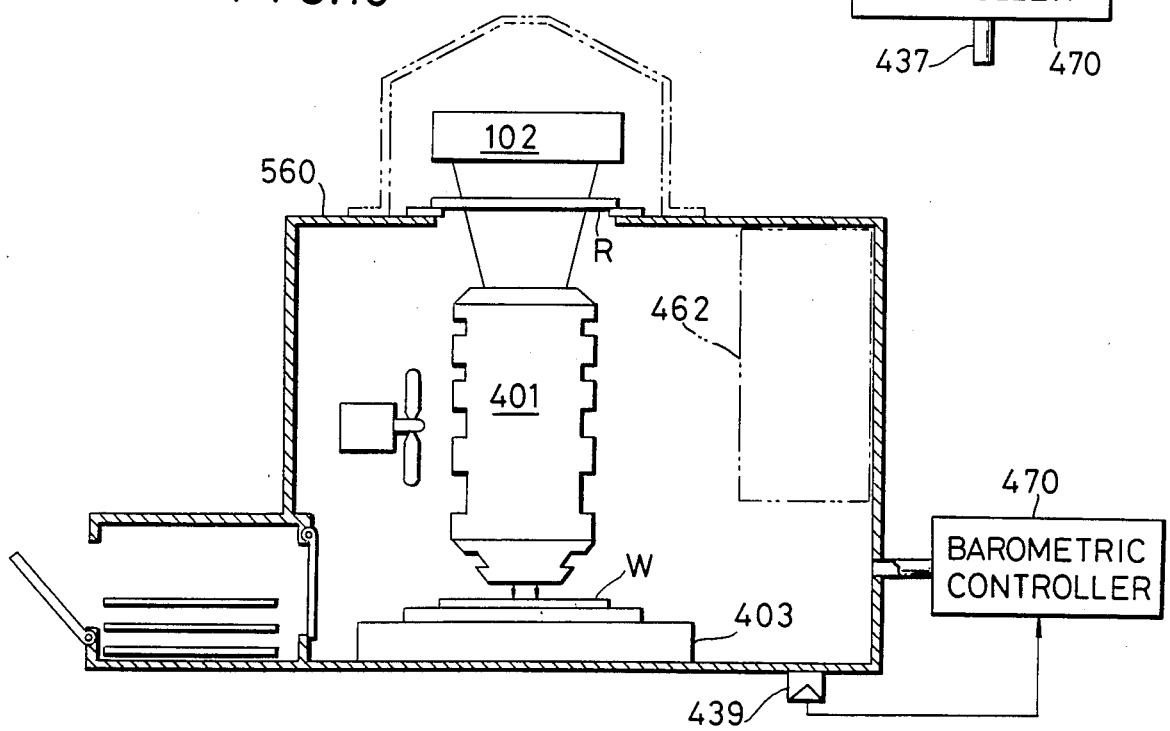
FIG. 10 shows a modification of the third embodiment.

It is possible to seal the operation chamber against the external atmosphere making use of the reticle itself as shown in FIG. 10. In this embodiment, the components from the under-surface of the reticle R to the stage 403 are air-tightly enclosed in a chamber 560.

Obviously many other modifications and variations of the present invention are possible in the light of the above teachings.

We claim:

1. Apparatus for projecting a pattern on a first plane onto a second plane, comprising:
    a projection lens system disposed between said first and second planes and including a plurality of lens elements arranged in a spaced relation and defining a plurality of spaces;
    means for isolating at least one of said spaces from the atmosphere;
    means for supplying a gas flow to at least another one of said spaces different from said isolated space for cooling the lens elements facing said another one space, said supply means having inlet means and outlet means at opposite sides of an optical path of said projection lens system, respectively, and passing said gas flow across said optical path from said inlet means to said outlet means; and
    means for changing the refractive index of said isolated space, said changing means including means for measuring the temperature of said projection lens system, means for measuring the pressure of the atmosphere and means for controlling said refractive index in response to the measured temperature of said projection lens system and the measured pressure of the atmosphere.

2. Apparatus according to claim 1, wherein said changing means further includes means for measuring the temperature of the atmosphere and said controlling means controls the pressure of the gas in said isolated space in accordance with the measured temperature of said projection lens system, the measured pressure of the atmosphere and the measured temperature of the atmosphere.

3. Apparatus according to claim 1, wherein said supply means includes filter means and supplies to said another one space the gas passed through said filter means.

4. Apparatus according to claim 1, wherein said changing means includes means for supplying gas to said isolated space and means for controlling the pressure of the gas in said isolated space.

5. Apparatus for projecting a pattern on a first plane onto a second plane, comprising:
    a projection lens system disposed between said first and second planes and including a plurality of lens elements arranged in a spaced relation and defining a plurality of spaces;
    means for isolating at least one of said spaces from the atmosphere;
    means for supplying a gas flow to said isolated space to cool the lens elements facing said isolated space, said supply means having inlet means and outlet means and passing said gas flow across an optical path of said projection lens system from said inlet means to said outlet means;

means for determining the pressure in said isolated space, which pressure causes said projection lens system to maintain a predetermined image-forming performance; and means for controlling the pressure of said gas flow in response to the determined pressure.

6. Apparatus according to claim 5, further comprising means for measuring the pressure of the atmosphere, and wherein said determining means determines the pressure in said isolated space in response to the measured pressure of the atmosphere.

7. Appratus according to claim 6, further comprising means for measuring the temperature of said projection lens system, and wherein said determining means determines the pressure in said isolated space in response to the measured temperature of said projection lens system.

8. Apparatus according to claim 5, wherein said pressure control means includes valve means provided in both of said gas inlet and said outlet means.

9. Apparatus according to claim 2, wherein said isolating means isolates at least two of said spaces from the atmosphere and includes means for connecting said isolated spaces with each other and wherein said inlet means is provided on one of said isolated spaces and said outlet means is provided on another of said isolated spaces so that said gas flows from said one isolated space to the other isolated space through said connecting means.

10. Apparatus according to claim 5, wherein said isolating means isolates at least two of said spaces from the atmosphere and said supply means flows said gas into and out of said isolated spaces individually.

11. Apparatus for projecting a pattern on a first plane onto a second plane, comprising:

a projection lens system disposed between said first and second planes and including a plurality of lens elements arranged in a spaced relation and defining a plurality of spaces;

means for isolating at least one of said spaces from the atmosphere;

means for measuring variation of the pressure of the atmosphere;

means responsive to said measuring means for determining a change of image-forming performance of said projection lens system caused by the variation of the pressure of the atmosphere;

means for determining the pressure in said isolated space, which pressure causes said projection lens system to cancel said change of image-forming performance; and means for supplying a gas flow to said isolated space and passing said gas flow therethrough, the pressure of said gas flow being controlled in response to said pressure determining means.

12. Apparatus for projecting a pattern on a first plane onto a second plane, comprising:

a projection lens system disposed between said first and second planes and including a plurality of lens elements arranged in a spaced relation and defining a plurality of spaces;

means for isolating at least one of said spaces from the atmosphere;

means for producing information with respect to variation of the temperature of said projection lens system;

means for determining a change of image-forming performance of said projection lens system caused by the variation of the temperature;

means for determining the pressure in said isolated space, which pressure causes said projection lens system to cancel said change of image-forming performance; and means for supplying a gas flow to said isolated space and passing said gas flow therethrough, the pressure of said gas flow being controlled in response to said pressure determining means.

13. Apparatus for projecting a pattern on a first plane onto a second plane, comprising:

a projection lens system disposed between said first and second planes and including a plurality of lens elements axially arranged in a spaced relation and defining a plurality of spaces;

means for supporting said lens elements and including a tubular member enclosing said lens elements therein, means for isolating at least two of said spaces from the atmosphere, and means for connecting said isolated spaces with each other;

inlet means communicating with one of said isolated spaces;

outlet means communicating with another of said isolated sapces;

means for supplying a controlled flow of gas to said inlet means; and means for venting the gas from said isolated spaces through said outlet means.

14. Apparatus according to claim 13, wherein said one isolated sapce and said another isolated space are successively arranged in a direction from said first plane to said second plane.

15. Apparatus for projecting a pattern on a first plane onto a second plane, comprising:

(a) a projection lens system disposed between said first and second planes and including a plurality of lens elements arranged in a spaced relation and defining at least one space, said projection lens system having a lens barrel means for supporting said lens elements, said lens barrel means being provided with an opening through which said space is opened to the exterior of said lens barrel means;

(b) a housing having a chamber for containing therein siad projection lens system and isolating said space from the atmosphere;

(c) means for filling said chamber of said housing with a pressure-regulated gas; and (d) means for circulating said gas within said chamber through said space, said gas being guided into said space through said opening.

16. Apparatus according to claim 15, which further comprises a temperature regulating means disposed in said housing for regulating the temperature of said gas.

17. Apparatus according to claim 15 wherein said housing encloses therein a space containing at least the projection optical path from said first plane to said second plane.

* * * * *